United States Patent
Iwayama et al.

(10) Patent No.: US 9,347,120 B2
(45) Date of Patent: May 24, 2016

(54) COMPOSITE MEMBER INCLUDING SUBSTRATE MADE OF COMPOSITE MATERIAL

(75) Inventors: Isao Iwayama, Osaka (JP); Taichiro Nishikawa, Osaka (JP); Toshiya Ikeda, Toyama (JP); Shigeki Koyama, Toyama (JP)

(73) Assignees: SUMITOMO ELECTRIC INDUSTREIS, LTD., Osaka-shi, Osaka (JP); A.L.M.T. Corp., Tokyo (JP)

( * ) Notice: Subject to any disclaimer, the term of this patent is extended or adjusted under 35 U.S.C. 154(b) by 0 days.

(21) Appl. No.: 14/000,247

(22) PCT Filed: Feb. 20, 2012

(86) PCT No.: PCT/JP2012/053953
§ 371 (c)(1),
(2), (4) Date: Aug. 19, 2013

(87) PCT Pub. No.: WO2012/127958
PCT Pub. Date: Sep. 27, 2012

(65) Prior Publication Data
US 2013/0328184 A1    Dec. 12, 2013

(30) Foreign Application Priority Data
Mar. 22, 2011   (JP) .................................. 2011-063209

(51) Int. Cl.
C22C 29/06     (2006.01)
H01L 23/15     (2006.01)
(Continued)

(52) U.S. Cl.
CPC ............. *C22C 29/065* (2013.01); *C04B 41/009* (2013.01); *C04B 41/515* (2013.01);
(Continued)

(58) Field of Classification Search
CPC .... C22C 29/06; C22C 2204/00; H04L 23/34; H04L 23/3735; H04L 2224/48091; H04L 2224/451245
USPC .......................................................... 257/712
See application file for complete search history.

(56) References Cited

U.S. PATENT DOCUMENTS

| | | | | |
|---|---|---|---|---|
| 2004/0144561 A1* | 7/2004 | Osanai | .................... | H01L 23/13 174/252 |
| 2008/0122052 A1* | 5/2008 | Fukui | ............................ | 257/678 |
| 2011/0256419 A1 | 10/2011 | Iwayama et al. | | |

FOREIGN PATENT DOCUMENTS

| | | |
|---|---|---|
| JP | 2003-277875 A | 10/2003 |
| JP | 2004-047619 A | 2/2004 |

(Continued)

OTHER PUBLICATIONS

Gupta et al., Determination of energy dissipation in Mg/SiC formulations using a new method of suspended beam coupled with circle fit approach, 2001.*

(Continued)

*Primary Examiner* — Allen Parker
*Assistant Examiner* — Ismail Muse
(74) *Attorney, Agent, or Firm* — Drinker Biddle & Reath LLP

(57) ABSTRACT

A composite member has a substrate made of a composite material having SiC combined with magnesium or a magnesium alloy, and has a warpage degree of not less than $0.01 \times 10^{-3}$ and not more than $10 \times 10^{-3}$, the warpage degree being defined as lmax/Dmax, where lmax being a difference between a maximum value and a minimum value of surface displacement of one surface of composite member measured along a longest side thereof, and Dmax being a length of the longest side. Thereby, a composite member capable of efficiently dissipating heat to an installation object, a heat-dissipating member using the composite member, and a semiconductor device having the heat-dissipating member are provided.

5 Claims, 3 Drawing Sheets

(51) Int. Cl.
  *H01L 23/373* (2006.01)
  *H01L 23/34* (2006.01)
  *C25D 7/12* (2006.01)
  *C04B 41/88* (2006.01)
  *C04B 41/00* (2006.01)
  *C04B 41/51* (2006.01)
  *C22C 1/10* (2006.01)
  *C04B 111/00* (2006.01)

(52) U.S. Cl.
  CPC .............. *C04B 41/88* (2013.01); *C25D 7/12* (2013.01); *H01L 23/15* (2013.01); *H01L 23/34* (2013.01); *H01L 23/3731* (2013.01); *H01L 23/3735* (2013.01); *H01L 23/3736* (2013.01); *B22F 2999/00* (2013.01); *C04B 2111/00844* (2013.01); *C22C 2001/1073* (2013.01); *C22C 2204/00* (2013.01); *H01L 2924/0002* (2013.01); *Y10T 428/2495* (2015.01); *Y10T 428/24612* (2015.01); *Y10T 428/263* (2015.01)

(56) References Cited

FOREIGN PATENT DOCUMENTS

| | | |
|---|---|---|
| JP | 2004-281676 A | 10/2004 |
| JP | 2010-042945 A | 2/2010 |
| JP | 2010-106362 A | 5/2010 |

OTHER PUBLICATIONS

Saravanan et al. [Fabrication and characterisation of pure magnesium-30 vol. % SiCP particle composite.*

Cao et al., Recent Developments on Ultrasonic Cavitation Based Solidification Processing of Bulk Magnesium Nanocomposites, 2008.*

Zuzanka et al., Magnesium Alloys Based Composite, Jan. 2011.*

Lan et al., Microstructure and microhardness of SiC nanoparticles reinforced, 2004.*

Lim et al., Wear behaviour of SiCp-reinforced magnesium matrix composites, 2003.*

Wang et al., SiC nanoparticles reinforced magnesium matrix composites fabricated by ultrasonic method, 2010.*

Inem et al., SiC Interface structure and fractography of a magnesium-alloy, metal-matrix composite reinforced with SiC particles, 1993.*

Saravanan et al. Fabrication and characterisation of pure magnesium-30 vol. % SiCp particle composite, Jan. 15, 2000, Elsevier, vol. 276, Issues 1-2, pp. 108-116.*

Lan. et al. Microstructure and microhardness of SiC nanoparticles reinforced magnesium composites fabricated by ultrasonic method, Nov. 25, 2004, Elsevier, vol. 386, Issues 1-2, pp. 284-290.*

* cited by examiner

FIG.1

COMPOSITE MEMBER INCLUDING SUBSTRATE MADE OF COMPOSITE MATERIAL

TECHNICAL FIELD

The present invention relates to a composite member including a composite material made of magnesium (so-called pure magnesium) or a magnesium alloy and SiC as a main component. In particular, the present invention relates to a composite member utilized as a heat-dissipating member for a semiconductor element and the like and capable of efficiently dissipating heat to an installation object.

BACKGROUND ART

As a heat-dissipating member (heat spreader) for a semiconductor element, a member utilizing a composite material made of a metal and a non-metal inorganic material (representatively, ceramics) such as Al—SiC, that is, a composite member, has been used. In recent years, a magnesium-based composite material including magnesium (Mg), which is lighter in weight than aluminum (Al), or an alloy thereof, as a matrix metal has been under consideration for the main purpose of achieving a lighter-weight composite member (see Japanese Patent Laying-Open No. 2010-106362 (Patent Document 1)).

The above composite member is representatively a flat plate member, and is utilized as a heat-dissipating member. Specifically, a semiconductor element and the like are mounted on one surface of the composite member serving as a heat-dissipating member. Further, the composite member is fixed to a cooling device such as a water cooler with bolts or the like such that the other surface thereof contacts the cooling device.

CITATION LIST

Patent Document

PTD 1: Japanese Patent Laying-Open No. 2010-106362

SUMMARY OF INVENTION

Technical Problem

As electronic equipment outputs higher power, the amount of heat generated by semiconductor elements in the electronic equipment during operation tends to be increased more and more. Therefore, it is desired to further enhance heat dissipation.

The closer the composite member adheres to an installation object such as the cooling device, the more quickly the heat of the semiconductor element and the like is transferred to the installation object, and the more efficiently the heat can be dissipated. That is, heat dissipation can be improved. Thus, it is considered to apply a lubricating oil such as grease between the composite member and the installation object to prevent a gap from being formed between the composite member and the installation object. However, merely interposing a lubricating oil therebetween has not served as a sufficient measure to deal with the demand for further improved heat dissipation.

Accordingly, one object of the present invention is to provide a composite member capable of efficiently dissipating heat of a semiconductor element and the like.

Solution to Problem

The present invention achieves the above object by providing a composite member having a specific shape.

A composite member in accordance with the present invention has a substrate made of a composite material having SiC combined with magnesium or a magnesium alloy. The composite member satisfies a warpage degree described below.

(Warpage Degree)

When a warpage degree is defined as a ratio of lmax to Dmax (lmax/Dmax), where lmax being a difference between a maximum value and a minimum value of surface displacement of one surface of the composite member measured along a longest side thereof, and Dmax being a length of the longest side, the warpage degree is not less than $0.01 \times 10^{-3}$ and not more than $10 \times 10^{-3}$.

In the composite member in accordance with the present invention, at least one surface thereof has a specific warped shape, and this warped surface can be referred to as a surface to be brought into contact with an installation object such as a cooling device (hereinafter referred to as a cooling-side surface). The warped surface, i.e., the cooling-side surface is pressed against the installation object to flatten out the warpage such that the surface becomes flat, and the composite member in accordance with the present invention can be fixed to the installation object in this flat state. Thus, the composite member in accordance with the present invention can fully adhere to the installation object by contacting the installation object in a pressed state and maintaining this contact state by bolts or the like. According to the present invention, particularly when a lubricant oil such as grease is interposed between the composite member and the installation object, the lubricant oil can be sufficiently spread all over the cooling-side surface of the composite member by the pressing. Thereby, the lubricant oil can be uniformly provided between the composite member and the installation object, and a gap is less likely to be formed between the composite member and the installation object. Therefore, the composite member can fully adhere to the installation object, and thus heat of a semiconductor element and the like can be dissipated utilizing the entire cooling-side surface. Hence, excellent heat dissipation can be achieved.

As one form of the composite member in accordance with the present invention, a form having a metal coating layer on at least a portion of the substrate is exemplified.

The metal coating layer is more excellent in wettability to solder than the composite material. Accordingly, when the metal coating layer is provided on the cooling-side surface of the substrate, heat dissipation can be further enhanced by joining the composite member to the installation object by soldering and bring them into adhesion. Alternatively, when the metal coating layer is provided on a surface which is opposite to the cooling-side surface and on which the semiconductor element and the like are to be mounted (hereinafter referred to as an element-side surface), heat dissipation can be enhanced by joining the composite member to the semiconductor element and the like by soldering and bring them into adhesion. Further, according to the above form, a plating layer can be provided on the metal coating layer. The plating layer can be easily formed by utilizing the metal coating layer as a conductive layer for electroplating. With the plating layer, for example, corrosion resistance or design property can be improved. In addition, according to the above form, the composite member having the above specific warped shape can be easily manufactured by manufacturing the metal coating layer under specific conditions as described later.

The composite member may have a first metal coating layer provided on one surface of the substrate and having a maximum thickness $t_1$max, and a second metal coating layer provided on the other surface of the substrate and having a maximum thickness $t_2$max. Preferably, a difference $|t_1\mathrm{max}-t_2\mathrm{max}|$ between the maximum thicknesses is not less than 0.02 mm.

The metal coating layer may be thin as long as it can be utilized as an underlayer for soldering or a conductive layer for plating as described above, and the metal coating layers formed on the respective surfaces of the substrate may have different thicknesses as with the above form. In particular, by manufacturing the metal coating layers under specific conditions described later such that the metal coating layers on the respective surfaces of the substrate have different thicknesses as with the above form, preferably such that there is a large difference between the thicknesses (absolute value), the composite member having the above specific warped shape can be easily manufactured utilizing a difference in the amounts of thermal expansion and contraction due to the difference between the thicknesses of the metal coating layers. Therefore, according to the above form, the composite member can be manufactured without performing, for example, surface treatment such as cutting or polishing, or another processing/treatment, which results in excellent productivity.

The metal coating layer provided on one surface of the substrate may have a flat surface, have a cross section in a thickness direction thereof having a curved shape, and have a difference between a maximum thickness and a minimum thickness in the cross section in the thickness direction of not less than 0.03 mm.

According to the above form, since the metal coating layer has one flat surface, a mounting area can be fully ensured when this surface serves as a mounting surface for the semiconductor element and the like. Further, in the above form, by forming the metal coating layer under specific conditions described later such that the metal coating layer becomes thick, the composite member having the above specific warped shape can be easily manufactured utilizing thermal contraction of the metal coating layer, which results in excellent productivity. Furthermore, for example by cutting or polishing a surface of the metal coating layer, the composite member having the metal coating layer with the flat surface can be easily manufactured.

The metal coating layer may have a maximum thickness of not less than 0.1 mm.

By forming the metal coating layer of the composite member to be thick under specific conditions described later such that the metal coating layer satisfies the above thickness, the composite member having the above specific warped shape can be easily manufactured utilizing thermal contraction of the metal coating layer as described above.

The substrate may have a SiC content of not less than 50% by volume and not more than 90% by volume.

According to the above form, since the substrate has a low thermal expansion coefficient and a high thermal conductivity, the entire composite member including the metal coating layer also tends to have a relatively low thermal expansion coefficient, which results in excellent consistency with thermal expansion coefficients of the semiconductor element and peripheral parts thereof, as well as excellent heat dissipation. Therefore, according to the above form, the composite member can be suitably utilized as a heat-dissipating member for the semiconductor element.

The substrate may have a thermal expansion coefficient of not less than 4 ppm/K and not more than 15 ppm/K, and a thermal conductivity of not less than 180 W/m·K.

According to the above form, the thermal expansion coefficient of the substrate is comparable to the thermal expansion coefficients of the semiconductor element and the peripheral parts thereof (about 4 ppm/K to 8 ppm/K) or only has a small difference therefrom, which results in excellent consistency in thermal expansion coefficient. Thus, when the composite member having the above form is utilized as a heat-dissipating member for the semiconductor element, the semiconductor element and the peripheral parts thereof are less likely to be peeled off even if they are subjected to heat cycles. Further, according to the above form, since the substrate has a sufficiently high thermal conductivity, the substrate can efficiently dissipate the heat of the semiconductor element and the like. Therefore, according to the above form, in addition to improved adhesion due to the warped shape, the substrate itself as a main constituent element of the composite member is also excellent in heat dissipation, and thus the composite member can be suitably utilized as a heat-dissipating member for the semiconductor element. Furthermore, since the substrate itself has a low thermal expansion coefficient and a high thermal conductivity, the composite member having the form further provided with the metal coating layer also tends to have a low thermal expansion coefficient, and is excellent in thermal conducting property.

A heat-dissipating member in accordance with the present invention is composed of the above composite member. Further, a semiconductor device in accordance with the present invention has the above heat-dissipating member, and a semiconductor element mounted on the heat-dissipating member.

Since the heat-dissipating member is composed of the composite member which can adhere to the installation object as described above, it is excellent in heat dissipation. Further, since the semiconductor device can efficiently dissipate the heat of the semiconductor element to the installation object via the heat-dissipating member, it is excellent in heat dissipation. As the semiconductor device, representatively, a semiconductor module such as a power module is exemplified.

Advantageous Effects of Invention

The composite member and the heat-dissipating member in accordance with the present invention are excellent in adhesion to the installation object, and can efficiently dissipate heat. The semiconductor device in accordance with the present invention is excellent in heat dissipation.

BRIEF DESCRIPTION OF DRAWINGS

FIG. 1 shows schematic views of composite members in various embodiments, and process illustration diagrams illustrating processes for manufacturing the composite members.

DESCRIPTION OF EMBODIMENTS

Figure 2:
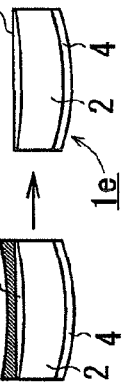
FIG. 2 shows schematic views of composite members in other embodiments, and process illustration diagrams illustrating processes for manufacturing the composite members.

Hereinafter, the present invention will be described in more detail.

<<Composite Member>>

Firstly, a substrate made of a composite material of a matrix metal and a non-metal inorganic material, as a main constituent element of a composite member, will be described.

[Substrate]

[Matrix Metal: Magnesium or Magnesium Alloy]

The metal component of the substrate is so-called pure magnesium containing not less than 99.8% by mass of Mg and an impurity, or a magnesium alloy composed of an additive element and the remainder containing Mg and an impurity. When the metal component is pure magnesium, the substrate has advantages such as improved thermal conducting property and a uniform structure. When the metal component is a magnesium alloy, the substrate has advantages such as lowered melting temperature due to lowered liquidus-line temperature, and improved corrosion resistance and mechanical characteristics (such as strength) of the substrate. As the additive element, at least one of Li, Ag, Ni, Ca, Al, Zn, Mn, Si, Cu, Zr, Be, Sr, Y, Sn, Ce, and rare earth elements (excluding Y and Ce) is exemplified. Since these elements cause a decrease in thermal conductivity if they are contained in a large amount, the total content thereof is preferably not more than 20% by mass (relative to the entire alloy set as 100% by mass; hereinafter, the same applies to the content of each additive element). In particular, preferably, the content of Al is not more than 3% by mass, the content of Zn is not more than 5% by mass, and the contents of other elements are each not more than 10% by mass. Adding Li has the effects of achieving a lighter-weight substrate and improving processability of the substrate. A known magnesium alloy, for example, an AZ-based, AS-based, AM-based, ZK-based, ZC-based, LA-based, or WE-based magnesium alloy can be utilized. Raw materials for the matrix metal are prepared to obtain a desired composition.

[Non-metal Inorganic Material: SiC]

<Composition>

SiC exhibits excellent effects as follows: (1) SiC has a thermal expansion coefficient of about 3 ppm/K to 4 ppm/K, which is close to thermal expansion coefficients of a semiconductor element and peripheral parts thereof; (2) SiC has a particularly high thermal conductivity among non-metal inorganic materials (single crystal: about 390 W/m·K to 490 W/m·K); (3) SiC powders and sintered bodies having various shapes and sizes are commercially available; and (4) SiC has a high mechanical strength. Accordingly, the substrate of the composite member in accordance with the present invention includes SiC as a constituent element. Besides, the substrate can contain a non-metal inorganic material which has a thermal expansion coefficient lower than that of Mg, which is excellent in thermal conducting property, and which is less likely to react with Mg, for example, at least one of $Si_3N_4$, Si, MgO, $Mg_2Si$, $MgB_2$, $Al_2O_3$, MN, diamond, and graphite.

<State of Presence>

SiC is present in the substrate in a form in which SiC particles are dispersed separately in the matrix metal (hereinafter referred to as a dispersed form), or in a form in which SiCs are coupled by a network portion for bonding SiCs (hereinafter referred to as a bonded form). The dispersed form has advantages as follows: (1) it can be manufactured utilizing SiC powder as a raw material, and formation of the above network portion is not required, resulting in excellent productivity; (2) it can be cut relatively easily; (3) it has a high toughness, and cracks are less likely to run; (4) since it has a Young's modulus lower than that of the bonded form, when warpage is formed utilizing thermal contraction of a metal coating layer described later, a large warpage is easily obtained even if the metal coating layer is thin; and (5) it is easily fixed to an installation object with bolts or the like. In the bonded form, since a continuous path for thermal conduction is formed by connecting SiCs by the network portion, the substrate tends to have a high thermal conductivity and a low thermal expansion coefficient. In particular, in a form in which the entire SiCs are coupled by the network portion and the matrix metal is charged into between SiCs, and in a form having this configuration with less closed pores (the closed pores accounting for not more than 10% by volume, preferably not more than 3% by volume, relative to the total volume of SiC in the substrate), further excellent thermal conducting property is obtained because the matrix metal is sufficiently present. The network portion representatively has a form composed of SiC, and can also have a form composed of the non-metal inorganic material other than SiC described above. The presence of the network portion and the ratio of the closed pores in the substrate can be checked or measured, for example, by observing a cross section of the substrate with an optical microscope or a scanning electron microscope (SEM).

<Content>

As the content of SiC in the substrate is increased, the thermal conductivity is increased, and the thermal expansion coefficient is likely to be decreased. When the content of SiC is not less than 50% by volume relative to the substrate set as 100% by volume, the substrate tends to have a thermal expansion coefficient of about 3.5 ppm/K to about 15 ppm/K, and the entire composite member including a metal coating layer tends to have a thermal expansion coefficient of not less than 4 ppm/K and not more than 15 ppm/K. When the content of SiC is not less than 60% by volume, and further not less than 65% by volume, the thermal conducting property can be further improved. When the content of SiC is not more than 90% by volume, and further not more than 85% by volume, the substrate is excellent in thermal characteristics and also in industrial productivity thereof.

[Outer Shape of Substrate]

The outer shape (planar shape) of the above substrate is representatively a rectangular shape (including a square shape). The rectangular shape has advantages as follows: (1) the substrate can be easily formed and has excellent manufacturability; and (2) an installation area for mounted parts such as a semiconductor element can be fully ensured. It is noted that the outer shape of the substrate is not limited to the rectangular shape, and various shapes can be employed depending on the shape and the number of the mounted parts, the installation object, and the like. For example, examples of the outer shape of the substrate include an odd shape having a protrusion provided with a bolt hole for fixing, and a shape having a curved portion such as a circular shape. It is noted that a through-hole such as a bolt hole may be provided in the substrate of various shapes.

[Outer Size of Substrate]

The outer size (width and length) and planar area of the above substrate can be selected as appropriate depending on the intended use and the above shape. When the substrate has a rectangular shape, for example, when the substrate has a large-sized foam such that at least one of the length and the width thereof is more than 100 mm, a large mounting area for the mounted parts such as the semiconductor element can be ensured, and the composite member can be utilized as a large-sized heat-dissipating member. In particular, in a large-sized composite member having a length of 100 mm and a width of 50 mm or larger, and further having a length of 150 mm and a width of 120 mm or larger, an area desired to contact the installation object has a large absolute value, and thus a gap is formed between the composite member and the installation object and a non-contact portion is likely to be formed. That is, in the large-sized composite member, an area which does not contact the installation object tends to have a large absolute value. When such a large-sized composite member is the composite member in accordance with the present invention having a specific warped shape, formation of the gap can be effectively reduced, and a contact area with the installation object can be fully ensured.

[Thickness of Substrate]

Although the thickness of the substrate can be selected as appropriate, it is preferably not more than 10 mm, particularly not more than 6 mm, when the composite member is utilized as a heat-dissipating member for the semiconductor element.

[Thermal Characteristics of Substrate]

When the content of SiC in the substrate is not less than 50% by volume, the thermal expansion coefficient of the substrate alone is low as described above. In addition, the thermal conductivity of the substrate alone is high, and for example, the substrate can have a thermal conductivity of not less than 180 W/m·K, further not less than 200 W/m·K, and particularly not less than 220 W/m·K.

[Metal Coating Layer]

[Region of Formation]

The composite member may be composed of the above substrate alone. In this case, the composite member tends to have a low thermal expansion coefficient. On the other hand, a metal coating layer may be provided on at least one of a pair of surfaces of the substrate opposite to each other. A region for forming the metal coating layer on the substrate can be selected as appropriate. When the composite member is utilized as a heat-dissipating member for the semiconductor element, it is preferable to form a metal coating layer on an element-side surface on which the mounted parts such as the semiconductor element are to be mounted, or a cooling-side surface which comes into contact with the installation object such as a cooling device, of the pair of surfaces, at least at a region where solder is applied or electroplating is performed, because excellent wettability to solder is obtained and the metal coating layer can be utilized as a conductive layer. Examples of a form which may be used include a form in which a metal coating layer is provided all over each surface of the substrate, a form in which a metal coating layer is partially provided on each surface of the substrate, a form in which a metal coating layer is provided all over only one of the surfaces of the substrate, and a form in which a metal coating layer is partially provided on only one of the surfaces of the substrate.

[Composition]

When the metal coating layer is composed of a structure which is continuous to the matrix metal in the substrate, the metal coating layer is less likely to be peeled off from the substrate due to excellent adhesion between the metal coating layer and the substrate, and good heat transfer between the metal coating layer and the substrate is obtained. Such a metal coating layer can be formed simultaneously when manufacturing the substrate by, for example, housing SiC as a raw material in a mold such that a gap is formed between the SiC as a raw material and the mold, and infiltrating the matrix metal into the SiC. Thus, excellent productivity is obtained. Further, in a form composed of the above continuous structure, the composite member in accordance with the present invention having a specific warped shape can be manufactured by forming the metal coating layer under specific conditions described later. Therefore, this form is excellent in the productivity of the composite member in accordance with the present invention.

Alternatively, the metal coating layer may have a composition different from that of the matrix metal. This composition may be a metal having a purity of not less than 99%, or an alloy. As the metal having a purity of not less than 99%, Al, Cu, or Ni can be used. Further, when this composition is an alloy, an alloy containing Al, Cu, and Ni as main components (i.e., an alloy containing Al, Cu, and Ni in a total amount of more than 50% by mass) can be used. The metal or alloy is excellent in corrosion resistance and thus has such an advantage that it can suppress corrosion of the matrix metal.

Another coating layer may be further formed on the metal coating layer, and for example, a plating layer may be formed. As a material for plating, Cu, Ni, or Zn can be used. Alternatively, as a material for plating, an alloy containing Cu, Ni, and Zn as main components (i.e., an alloy containing Cu, Ni, and Zn in a total amount of more than 50% by mass) can be used. As a plating method, while an electroless plating method may be employed, a plating layer can be easily formed when an electroplating method is employed using the metal coating layer as a conductive layer. When pretreatment such as zincate treatment is performed as appropriate, adhesion between the metal coating layer and the plating layer can be enhanced.

[Thickness]

Figure 1:
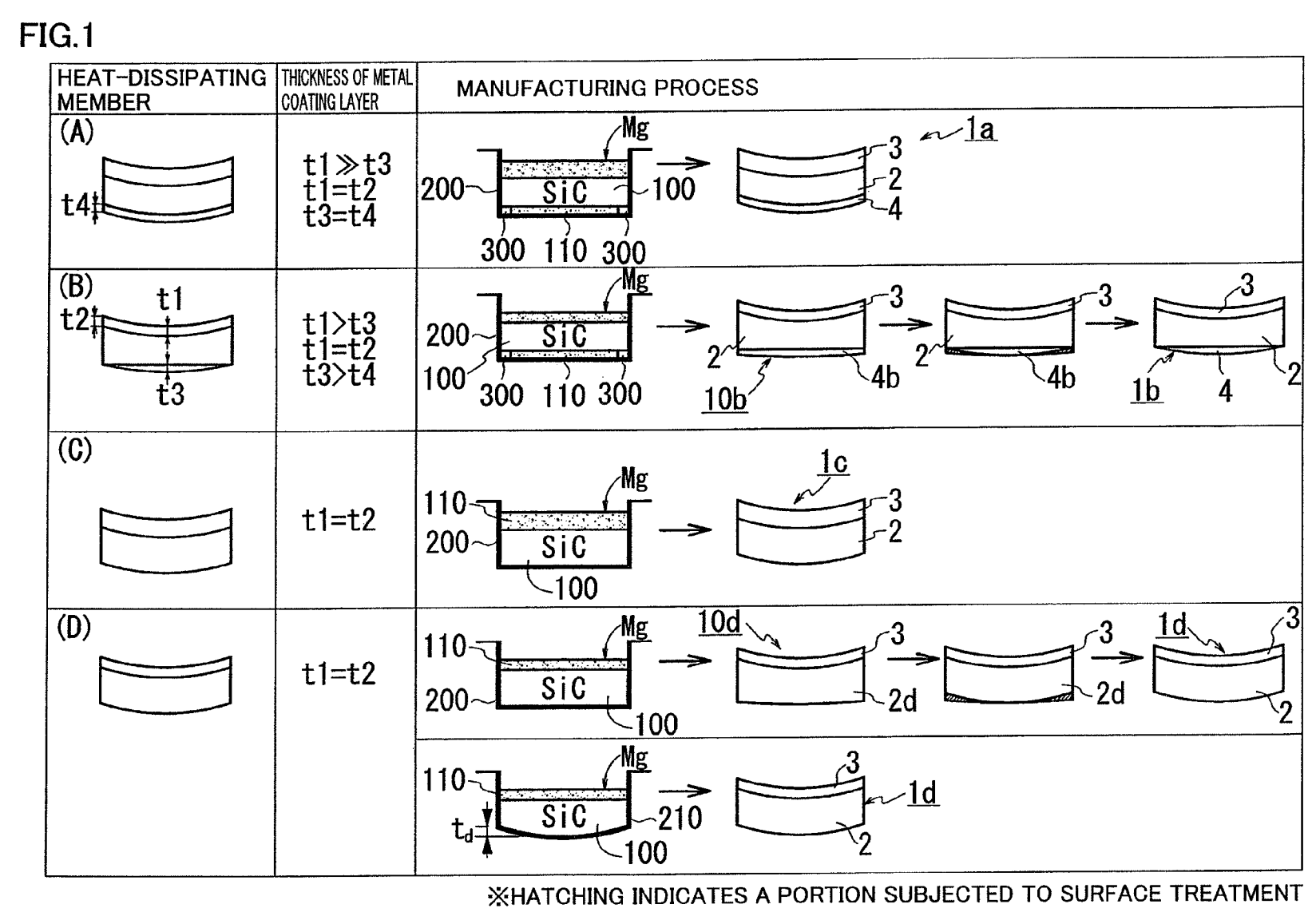

The metal coating layers provided on the surfaces of the substrate can have a form in which each metal coating layer entirely has a uniform thickness (for example, a composite member 1a shown in FIG. 1(A) and the like), or a form in which at least one metal coating layer has a thickness that varies partially (for example, a composite member 1b shown in FIG. 1(B) and the like). In either form, when the metal coating layer has a minimum thickness of not less than the metal coating layer can be suitably utilized as an underlayer for soldering, a conductive layer for plating, or the like. Further, in either form, when the metal coating layer has a maximum thickness of not less than 0.01 mm (10 µm), preferably not less than 0.1 mm (100 µm), the composite member in accordance with the present invention having a specific warped shape can be easily manufactured utilizing thermal contraction and the like during formation of the metal coating layer as described above. As the metal coating layer becomes thicker, a larger warpage is easily obtained, and a form having a maximum thickness of not less than 0.3 mm, and further not less than 0.5 mm, is exemplified. Since an excessively thick metal coating layer causes an increase in the thermal expansion coefficient of the entire composite member including the metal coating layer, and a decrease in the thermal conductivity of the composite member, the metal coating layer provided on each surface preferably has a maximum thickness of not more than 1.5 mm, further not more than 1 mm, and particularly not more than 0.5 mm. In addition, the ratio of the thickness of the metal coating layer to the thickness of the composite member is preferably not more than 50%, and further not more than 20%.

Examples of a form in which a metal coating layer provided on one surface of the substrate has a thickness that varies partially include a form having a convexly curved shape in which the thickness of the metal coating layer is thickest at a central portion and becomes thin toward each edge portion (for example, a composite member 1f shown in FIG. 2(F)), and a form having a concavely curved shape in which the thickness of the metal coating layer is thinnest at a central portion and becomes thick toward each edge portion, in a cross section in a thickness direction of the composite member in accordance with the present invention. In a form in which a metal coating layer is provided on only one surface of the substrate, the metal coating layer has a difference between the maximum thickness and the minimum thickness in a cross section in the thickness direction of not less than 0.03 mm, and the metal coating layer has a flat surface (for example, a composite member 1h shown in FIG. 2(H)), the metal coating layer is obtained by forming a thick metal coating layer and subjecting it to surface treatment such as polishing. Thus, the composite member in accordance with the present invention in the above form having a specific warped shape can be easily manufactured utilizing thermal contraction of the thick metal coating layer. As the difference becomes larger, warpage tends to become larger, and a form having the difference of not less than 0.1 mm, and further not less than 0.2 mm, is exemplified.

Examples of a form in which the substrate has metal coating layers on both surfaces can include a form in which the metal coating layers on the surfaces have an equal maximum thickness (for example, a composite member $1j$ shown in FIG. 2(J)), and a form in which the metal coating layers on the surfaces of the substrate have different maximum thicknesses (for example, composite member $1a$ shown in FIG. 1(A)). In this form, when a metal coating layer is formed on each of both surfaces of a metal substrate, the both layers are formed to have a large difference in maximum thickness, and thus a composite member having a specific warped shape can be easily manufactured utilizing a difference in the amounts of thermal expansion and contraction of the both layers. In particular, when a difference between a maximum thickness $t_1max$ of a first metal coating layer provided on one surface of the substrate and a maximum thickness $t_2max$ of a second metal coating layer provided on the other surface of the substrate, i.e., $|t_1max-t_2max|$, is not less than 0.02 mm, specific warpage can be provided utilizing the difference in the amounts of thermal expansion and contraction, without additionally performing surface treatment such as cutting or polishing. As the difference in maximum thickness, i.e., $|t_1max-t_2max|$, becomes larger, the warpage tends to become larger, and a form having the difference of not less than 0.1 mm, further not less than 0.3 mm, and particularly not less than 0.5 mm, is exemplified. However, since thicknesses themselves of the metal coating layers become large if the difference in maximum thickness is too large, the difference is preferably not more than 1.5 mm, and further not more than 1.0 mm.

[Warpage Degree]

The composite member has a specific warped shape as described above. With a warpage degree (lmax/Dmax) of not less than $0.01 \times 10^{-3}$ (not less than $1 \times 10^{-5}$), when the composite member is fixed to the installation object, the composite member can adhere to the installation object by pressing the composite member against the installation object to flatten out warpage and fixing it. Thus, heat of a heating object such as a semiconductor element mounted on the composite member can be efficiently dissipated to the installation object, and the composite member is excellent in heat dissipation. The larger the warpage degree is, the more sufficiently the composite member is pressed against the installation object, and accordingly the warpage degree is preferably not less than $0.05 \times 10^{-3}$ (not less than $5 \times 10^{-5}$), and further not less than $0.1 \times 10^{-3}$ (not less than $10 \times 10^{-5}$ ($1 \times 10^{-4}$)). If the warpage degree is too large, there is a possibility that a gap may be formed between the composite member and the installation object even if the composite member is fixed with bolts or the like, and thus the warpage degree is set to not more than $10 \times 10^{-3}$ (not more than $1000 \times 10^{-5}$ ($1 \times 10^{-2}$)). The warpage degree is preferably not more than $5 \times 10^{-3}$ (not more than $500 \times 10^{-5}$), particularly $0.2 \times 10^{-3}$ to $2 \times 10^{-3}$. Further, a form having a warpage degree of not more than $1 \times 10^{-3}$ (not more than $100 \times 10^{-5}$) can be adopted.

It is only necessary that at least one of the pair of surfaces opposite to each other (i.e., the cooling-side surface and the element-side surface) in the composite member satisfies the above warpage degree, and it is desirable to utilize the surface satisfying the above warpage degree as the cooling-side surface. Further, the cooling-side surface is preferably warped in a convex shape.

When the composite member has, for example, a rectangular shape, the longest side in one surface of the composite member is a diagonal line, and the length of the longest side (Dmax) is the length of the diagonal line. When the composite member has a circular shape, the longest side is a diameter. When the composite member has an elliptical shape, the longest side is a major axis. Displacement of a surface along the longest side can be easily measured by utilizing a commercially available three-dimensional shape measuring device such as a laser displacement measuring device. A device that can automatically compute a difference in the displacement (lmax) may be utilized. As a simplified technique, a measurement method described below can be utilized. With a composite member being placed on a horizontal table, a difference between a maximum distance and a minimum distance in a vertical direction between a surface of the composite member which is arranged to face the horizontal table and does not contact the horizontal table and a surface of the horizontal table is measured as lmax, and the length of the longest side of the composite member is measured as Dmax, to obtain the warpage degree (lmax/Dmax).

While a concrete warpage amount (mm) differs depending on the size (outer size: length×width) of the composite member, for example, in the case of a rectangular composite member having a length of 137.5 mm and a width of 70.5 mm to a length of 187.5 mm and a width of 137.5 mm, the difference in the displacement (lmax) is 0.05 mm to 0.3 mm (warpage degree: about $0.2 \times 10^{-3}$ ($20 \times 10^{-5}$) to about $3 \times 10^{-3}$ ($300 \times 10^{-5}$)).

[Thermal Characteristics of Composite Member]

Although a composite member having a metal coating layer tends to have a thermal expansion coefficient larger than that of a composite member composed of a substrate alone, it can have a form satisfying a thermal expansion coefficient of not less than 4 ppm/K and not more than 15 ppm/K by selecting the thickness, material, and the like of the metal coating layer. This form is excellent in consistency with the thermal expansion coefficients of the semiconductor element and the peripheral parts thereof. Further, since the composite member has a substrate containing a specific amount of SiC as described above, the composite member has a high thermal conductivity, and even when the composite member includes a metal coating layer, it can obtain a thermal conductivity of, for example, not less than 180 W/m·K. By increasing a filling rate of SiC and providing the network portion as described above, or decreasing the total thickness of the metal coating layers, a composite member having a lower thermal expansion coefficient and a higher thermal conductivity can be obtained. For example, a composite member having a thermal conductivity of not less than 200 W/m·K, further not less than 250 W/m·K, and particularly not less than 300 W/m·K can be obtained. In addition to high thermal conductivity of the composite member itself as described above, adhesion between the composite member and the installation object is enhanced by the composite member having the above specific warpage, and thereby the heat of the semiconductor element and the like is efficiently dissipated to the installation object. That is, the composite member is excellent in heat dissipation. It is noted that, when a composite member having a metal coating layer is used, the thermal expansion coefficient and thermal conductivity thereof can be measured using a commercially available device. Further, the thermal expansion coefficient can also be calculated by the rule of mixtures, considering stiffness and the like of each material constituting the composite member.

[Other Configurations]

The composite member in accordance with the present invention can be directly utilized as a heat-dissipating member for the semiconductor element. In addition, the composite member can have a form in which a through hole through which a fixing member such as a bolt for fixing the composite member to the installation object is provided at an appropriate location (representatively, in the vicinity of a corner portion or a peripheral edge of the substrate). The through hole can be formed simultaneously with the composite member by forming, for example, a metal tube or the like integrally with the composite member. Alternatively, the through hole can be formed by fabricating a composite member having a substrate with a metal piece integrated at an appropriate location, and forming a hole in the metal piece. Alternatively, the through hole can be formed at an appropriate location in the substrate of the composite member, using a laser, discharge machining, or the like. The material for the metal piece or the metal tube described above may be the same metal as the metal component of the substrate, or at least a portion thereof may include a different material, for example, stainless steel or a non-metal high-strength material such as carbon (including the one having a fibrous form). By including the high-strength material, the axial force of the bolts is less likely to be decreased. The through hole may be any of a threaded hole and a smooth hole with no threads.

<<Manufacturing Method>>

The above composite member can be representatively manufactured by manufacturing methods described below.

[Manufacturing Method 1: Form of Automatically Forming a Warped Shape Utilizing a Metal Coating Layer]

In the manufacturing method of this form, the composite member in accordance with the present invention having the above specific warped shape is obtained simultaneously with formation of a metal coating layer.

[Manufacturing Method 1-1: Case where the Composite Member has Metal Coating Layers on Both Surfaces of a Substrate]

This method for manufacturing the composite member relates to a method for manufacturing a composite member having a plate-like substrate made of a composite material formed by combining magnesium or a magnesium alloy with SiC. A coated compact having the substrate made of the composite material of magnesium or a magnesium alloy and SiC, and metal coating layers each provided on at least a portion of each of a pair of opposite surfaces of the substrate, is formed by an infiltration method. The metal coating layers are formed such that, when it is defined that the metal coating layer on one surface of the substrate has maximum thickness $t_1$max and the metal coating layer on the other surface of the substrate has maximum thickness $t_2$max, the difference in maximum thickness, i.e., $|t_1\text{max}-t_2\text{max}|$, is not less than 0.02 mm.

[Manufacturing Method 1-2: Case where the Composite Member has a Metal Coating Layer on Only One Surface of a Substrate]

This method for manufacturing the composite member relates to a method for manufacturing a composite member having a plate-like substrate made of a composite material formed by combining magnesium or a magnesium alloy with SiC. A coated compact having the substrate made of the composite material of magnesium or a magnesium alloy and SiC, and a metal coating layer provided on at least a portion of one of a pair of opposite surfaces of the substrate, is formed by the infiltration method. The metal coating layer is formed to have a maximum thickness of not less than 0.01 mm.

As one form of manufacturing method 1, a composite member satisfying the above warpage degree may be formed by further performing surface treatment on at least one of a pair of opposite surfaces of the coated compact. As the surface treatment, cutting or polishing can be used.

As one form of manufacturing method 1, a form in which a curved mold whose surface for forming a metal coating layer has a curved shape is utilized as a mold to be used in the above infiltration method is exemplified.

[Manufacturing Method 2: Form of Forming a Warped Shape by Surface Treatment]

In the manufacturing method of this form, the composite member having the above specific warped shape is obtained irrespective of the presence or absence of a metal coating layer.

This method for manufacturing the composite member relates to a method for manufacturing a composite member having a plate-like substrate made of a composite material formed by combining magnesium or a magnesium alloy with SiC, and has the following steps. The substrate made of the composite material of magnesium or a magnesium alloy and SiC is formed. Surface treatment is performed on at least one surface of the substrate to form the composite member satisfying the above warpage degree. As the surface treatment, cutting or polishing can be used.

As one form of manufacturing method 2, a metal coating layer may be further formed on the substrate satisfying the above warpage degree.

As one form of manufacturing method 2, a metal coating layer may be formed on the substrate, and the surface treatment may be performed on the substrate having the metal coating layer.

As one form of manufacturing method 2, the substrate may be formed by the infiltration method, and a curved mold whose surface for forming one surface of the substrate has a curved shape may be utilized as a mold to be used in the infiltration method.

Hereinafter, the above manufacturing methods will be described in more detail.

[Raw Material]

As a matrix metal, an ingot of pure magnesium or a magnesium alloy can be suitably utilized. As a raw material for SiC, for example, SiC powder can be utilized. In particular, when the SiC powder is particulate or fibrous and has an average particle size (average minor axis in the case of fibrous powder) of not less than 1 μm and not more than 3000 μm, particularly not less than 5 μm and not more than 200 μm, it facilitates manufacturing of a powder compact and the like described later. When plural types of powders having different average particle sizes are used in combination, the filling rate of SiC is easily increased.

Since a non-metal inorganic material such as SiC used as a raw material is present substantially as it is in the substrate of the composite member, volume ratios of SiC and pores and the state of the presence of the network portion in the substrate depend on the raw material used, and are substantially equal to those of the raw material. Therefore, the properties and the amount of the raw material are selected as appropriate such that the substrate has desired thermal characteristics. Further, the shape and size of a mold (die) are selected as appropriate such that the substrate has desired shape and size.

The SiC powder may be used as it is to fill a desired mold by tapping or the like, or formed into a compact that can be handled (representatively, a powder compact, and further, a sintered body formed by sintering the powder compact). The powder compact can have a form, for example, formed by any of slip casting (i.e., molding slurry prepared using raw material powder, water, and a dispersant, and thereafter drying the molded slurry), pressure forming (such as dry pressing, wet pressing, uniaxial pressure forming, CIP (isostatic pressing), and extrusion molding), and a doctor blade method (i.e., pouring slurry prepared using raw material powder, a solvent, an antifoamer, a resin, and the like into a doctor blade, and thereafter evaporating the solvent). The sintered body can have a form prepared by sintering the above powder compact or a tapped powder aggregate (representatively, a SiC porous body having a network portion). When the content of SiC in the substrate is increased to, for example, not less than 70% by volume, slip casting, pressure forming, or the doctor blade method can be suitably utilized to form the powder compact. When the content of SiC in the substrate is low, it is desirable to use tapping.

The sintered body has advantages as follows: (1) since it is stronger than the powder compact, it is less likely to be chipped or otherwise damaged when it is housed in a mold and the like, and thus easily handled; (2) a porous body can be easily fabricated; and (3) the sintered body can be densified by adjusting sintering temperature and holding time, and thus the filling rate of SiC can be easily improved. Sintering is performed under conditions of, for example: (1) vacuum atmosphere, a heating temperature of 800° C. to less than 1300° C., and a holding time of about 10 minutes to 2 hours; or (2) ambient atmosphere, a heating temperature of 800° C. to 1500° C., and a holding time of about 10 minutes to 2 hours. Under conditions (1) and (2), there is a tendency that a SiC compact having no network portion is obtained. On the other hand, when sintering is performed under conditions of vacuum atmosphere, a heating temperature of not less than 1300° C. and not more than 2500° C., and a holding time of 2 hours to 100 hours, SiCs can be directly bonded, and a SiC porous body having a network portion formed of SiC is obtained. By utilizing a sintered body (representatively, a SiC porous body) having a network portion as a raw material, a substrate having a network portion is easily obtained. A commercially available SiC sintered body (having open pores) may also be utilized. In particular, when a porous body having less closed pores (not more than 10% by volume, preferably 3% by volume, relative to the total volume of a sintered body) and having open pores is used as a raw material, a molten metal of the matrix metal can be fully infiltrated into the porous body, and thus a composite member excellent in thermal characteristics is obtained.

[Formation of an Oxide Film]

When SiC having an oxide film on its surface is utilized as a raw material, wettability between SiC and the matrix metal is improved. This facilitates infiltration of the molten metal of the matrix metal by capillary action, even when a gap between SiCs is very small. The oxide film may be formed on the SiC powder, or may be formed on the powder compact or the sintered body described above. Conditions for forming the oxide film are identical in the case where it is formed on the powder and the case where it is formed on the sintered body or the like, and the heating temperature is preferably not less than 700° C., particularly not less than 750° C., and further not less than 800° C., and is particularly preferably not less than 850° C., and further not less than 875° C. and not more than 1000° C.

[Combining]

The infiltration method can be suitably utilized to form the coated compact in manufacturing method 1 and the substrate in manufacturing method 2. The infiltration method is a method for infiltrating a melted matrix metal (a molten metal of magnesium or a magnesium alloy) into SiC powder, a sintered body, or the like housed in a mold for combining. By solidifying the infiltrated matrix metal, a substrate made of a magnesium-based composite material is obtained. In addition to the infiltration method, a powder metallurgy method, a melting method, or the like can be utilized to form the substrate in manufacturing method 2.

When the combining is performed in an atmosphere of not less than $0.1 \times 10^{-5}$ MPa and not more than an atmospheric pressure (generally 0.1 MPa (1 atm)), the molten metal is easily handled, and pores caused by taking in gas in the atmosphere are less likely to be formed. Further, when the combining is performed in an inert atmosphere such as Ar, a reaction between a Mg component and atmosphere gas can be prevented, and deterioration of thermal characteristics due to the presence of a reaction product can be suppressed. When the matrix metal is magnesium (pure Mg), the infiltration temperature is preferably not less than 650° C. Since wettability is improved with an increase in the infiltration temperature, the infiltration temperature is preferably not less than 700° C., particularly not less than 800° C., and further not less than 850° C. However, if the infiltration temperature is more than 1000° C., defects such as a shrinkage cavity and a gas hole may occur or Mg may boil, and thus the infiltration temperature is preferably not more than 1000° C. Further, the infiltration temperature is more preferably not more than 900° C. to suppress excessive oxidation and generation of a crystallized product.

It is expected that a substrate and a metal coating layer having less internal defects and surface defects can be obtained by controlling a cooling direction and a cooling speed for a composite while the matrix metal is solidified. For example, cooling is performed in SiC housed in the mold in one direction from a side opposite to a side where the molten metal is supplied. That is, cooling is performed from a side where the molten metal has already been supplied toward a side where the molten metal is to be supplied. Thereby, cooling proceeds as the unsolidified molten metal compensates for a decrease in the volume of the already solidified portion, and thus the above defects are less likely to occur. In particular, in the case of forming a large-sized composite member, it is preferable to utilize this cooling method, because a composite member having less defects and excellent thermal characteristics can be obtained. The cooling speed is preferably adjusted to have a temperature gradient of, for example, not less than 0.1° C./mm, particularly not less than 0.5° C./mm.

[Manufacturing Method 1]

When the above coated compact is formed by the infiltration method, a metal coating layer can be formed simultaneously at the time of combining, by arranging an appropriate spacer in the mold as described in Patent Document 1. Examples of the material for the spacer include naphthalene, carbon, iron, and stainless steel (for example, SUS430). The spacer has a shape of a band-like body, a linear body, or the like. By utilizing a spacer having an appropriate size (thickness), a metal coating layer having a thickness corresponding to the size of the spacer can be easily formed. It is desirable to utilize a spacer having a desired size according to the thickness of a metal coating layer. The spacer may remain in the composite member, or may be removed. Further, utilizing a spacer made of a material which is removable by heat generated at the time of combining (such as naphthalene) eliminates a removal step.

In manufacturing method 1-1, metal coating layers having different thicknesses can be easily formed by utilizing spacers having different sizes. By forming the metal coating layers to have different thicknesses, the composite member can be warped utilizing a difference between the amounts of thermal expansion and contraction of the metal coating layers during cooling. Specifically, since a thicker metal coating layer has a larger amount of thermal contraction, the coated compact is warped to stretch a side having a thinner metal coating layer. Representatively, the side having the thinner metal coating layer has a convex shape, and the side having the thicker metal coating layer has a concave shape. In order to manufacture the composite member in accordance with the present invention satisfying the above warpage degree, it is desirable to adjust the size of the spacer such that the difference between maximum thickness $t_1$max and maximum thickness $t_2$max is not less than 0.02 mm, as described above.

In manufacturing method 1-2, by forming a metal coating layer on only one surface of the substrate, the composite member can be warped utilizing thermal contraction of the metal coating layer during cooling. Specifically, since a side having the metal coating layer is thermally contracted more, the substrate is warped to stretch a side having no metal coating layer. Representatively, the side having no metal coating layer has a convex shape, and the side having the metal coating layer has a concave shape. In order to manufacture the composite member in accordance with the present invention satisfying the above warpage degree, it is desirable to adjust the size of the spacer such that the metal coating layer has a maximum thickness of not less than 0.01 mm, preferably not less than 0.1 mm, as described above.

Excess or deficiency in warpage can be easily adjusted by performing surface treatment such as cutting or polishing on the coated compact obtained by manufacturing method 1. That is, the warpage degree can be easily adjusted. Further, since surface roughness can be reduced by surface treatment, adhesion to the installation object can be enhanced. The same applies to manufacturing method 2. When the above surface treatment is performed on a metal coating layer, the metal coating layer may be formed to be thick beforehand. When the surface treatment is performed on a metal, good processability is obtained when compared with the case where cutting or the like is performed on the composite material. When the metal coating layer is composed of magnesium or a magnesium alloy, wet processing is preferably used to prevent scattering of dust. Since magnesium or a magnesium alloy is a material that can be easily cut, cutting or polishing can be easily performed thereon. When surface treatment such as cutting or polishing is performed on the substrate made of the composite material, it is desirable to use a high-hardness tool such as a diamond tool, or laser processing or discharge machining.

When the above surface treatment is performed on the metal coating layer formed by the infiltration method, if the surface treatment is performed immediately after the coated compact is obtained, a desired warpage degree may not be obtained due to a change in residual stress in the metal coating layer during the surface treatment. Thus, it is preferable to fully release internal stress in the metal coating layer after the coated compact is formed, and thereafter perform the surface treatment. Thereby, a composite member satisfying a desired warpage degree can be obtained with high accuracy. The internal stress can be fully released by appropriate heat treatment (for example, at 100° C. to 200° C. for 100 hours to 1000 hours). It is expected that the internal stress can also be released by leaving the metal coating layer for a long time (for example, about 30 days to 100 days) at ordinary temperature (about 20° C. to 30° C.). For example, even when the composite member has been stored in a warehouse or the like and its warpage degree has changed, the warpage degree can be adjusted by performing surface treatment immediately before the composite member is incorporated into electronic equipment. Alternatively, the amount of surface treatment may be set by assuming warpage after the surface treatment to obtain a desired warpage degree.

In addition, when the above curved mold is used, a large warpage degree is easily obtained, when compared with the case of using a flat mold whose surface for forming a metal coating layer is a flat surface. The degree of curvature of the curved mold can be selected as appropriate to obtain a desired warpage degree. Both a curved mold whose surface for forming a metal coating layer has a convex shape and a curved mold whose surface for forming a metal coating layer has a concave shape can be utilized. When the concave curved mold is used, a small warpage degree is easily obtained. The warpage degree can also be adjusted by changing the shape of the mold as described above. The matter related to the curved mold is generally similarly applied to manufacturing method 2.

[Manufacturing Method 2]

In manufacturing method 2, since the substrate is manufactured by the infiltration method or the like and then subjected to surface treatment such as cutting to form a specific warpage as described above, a composite member having no metal coating layer can be formed. By forming a metal coating layer on the substrate having the specific warpage, a composite member having the metal coating layer can be obtained even when manufacturing method 2 is utilized. The metal coating layer is formed on the substrate having the specific warpage by utilizing electroless plating, hot-dip plating, evaporation, a cold spray method, or the like, or by utilizing brazing, ultrasonic joining, an oxide soldering method, joining with an inorganic adhesive, or the like using a metal plate having an appropriate shape. By utilizing these techniques, a composite member having a metal coating layer with a composition different from that of the matrix metal can be easily manufactured.

Alternatively, warpage may be formed by surface treatment after a metal coating layer is formed on the substrate. In this case, since a substrate having both surfaces being flat can be utilized, the metal coating layer can be easily formed. The metal coating layer can be formed by utilizing electroless plating, hot-dip plating, evaporation, the cold spray method, brazing, ultrasonic joining, enveloped casting, rolling (clad rolling), hot pressing, the oxide soldering method, joining with an inorganic adhesive, or the like. Also in this case, metal coating layers of various compositions can be easily formed as described above.

[Other Manufacturing Methods]

In addition, the composite member in accordance with the present invention having a metal coating layer can be manufactured by arranging a metal plate with a desired composition in a mold, performing enveloped casting thereon simultaneously with the above combining to fabricate a coated compact, and performing the surface treatment described above on the obtained coated compact. Alternatively, the composite member in accordance with the present invention can be manufactured by fabricating a coated compact (representatively, the one substantially having no warpage) by the infiltration method as in manufacturing method 1, and performing the surface treatment on the coated compact to satisfy a specific warpage degree. On the other hand, the composite member in accordance with the present invention having no metal coating layer can also be manufactured by utilizing the infiltration method using the curved mold described above.

Alternatively, instead of fabricating a substrate (of a flat type substantially having no warpage (which may have or may not have a metal coating layer)) made of the composite material by the infiltration method or the like, and performing surface treatment such as cutting on the substrate, a composite member satisfying the above specific warpage degree can be formed by sandwiching the above substrate between a pair of dies having warped shapes (a first curved die in which one surface contacting the substrate is a concave surface, and a second curved die having a convex surface corresponding to the concave) and applying load in a heated state. The concave and the convex of the dies can be selected as appropriate to obtain a desired warped shape. The heating temperature is preferably not less than 100° C. and not more than 470° C. By setting the heating temperature to not more than 470° C., the risk of spontaneous ignition of the matrix metal (magnesium or an alloy thereof) can be reduced. By setting the heating temperature to not less than 100° C., the substrate made of the above composite material can be warped (deformed) in a relatively short time. As the heating temperature is increased, the load required for deformation can be decreased, and the composite member satisfying the specific warpage degree can be formed without utilizing a high-power pressing machine. Further, when the heating temperature is low within the above range, high-power heating means is not necessary, and the heating time can be shortened and the die can have a longer life. Therefore, the heating temperature is preferably not less than 150° C., particularly not less than 200° C., and preferably not more than 350° C., particularly not more than 300° C. The load is preferably not less than 10 kg/cm². If the load is too large, a high-power pressing machine as described above is required and the die has a shorter life. Therefore, the load is preferably not more than 500 kg/cm². The load can be selected depending on the heating temperature and the warpage degree to be formed. For example, a large load can be applied in a low-temperature region and a small load can be applied in a high-temperature region within the above temperature range. Further, by setting the load to not less than 50 kg/cm² in a temperature region of 100° C. to 200° C. within the above temperature range, the composite member satisfying the above specific warpage degree can be satisfactorily formed. In this manufacturing method, it is preferable to utilize a substrate having a dispersed form fabricated using SiC powder.

<<Forms of Specific Composite Members and Manufacturing Methods Thereof>>

Hereinafter, configurations of composite members in the present embodiment having a metal coating layer and manufacturing methods thereof will be described more specifically with reference to FIGS. 1 and 2. In FIGS. 1 and 2, parts having the same names, and the same locations will be designated by the same reference numerals. Further, in composite members and coated compacts shown in FIGS. 1 and 2, an upper side will be referred to as an element side, and an opposite lower side will be referred to as a cooling side. It is noted that warpage is shown in FIGS. 1 and 2 in an exaggerated manner for easy understanding. The composite member in accordance with the present invention has two forms: one is a form in which both of a pair of opposite surfaces of a substrate have warped shapes, and the other is a form in which only one of a pair of opposite surfaces of a substrate has a warped shape and the other surface has a flat shape.

[Form in which Both Surfaces of a Substrate have Warped Shapes]

Composite members 1a to 1d shown in FIGS. 1(A) to 1(D) each have a substrate 2, and at least one of metal coating layers 3 and 4. Metal coating layer 3 is formed on one of a pair of opposite surfaces of substrate 2 (here, an element-side surface). Metal coating layer 4 is formed on the other of the pair of surfaces (here, a cooling-side surface). Substrate 2 is made of a composite material of SiC and a matrix metal made of magnesium or an alloy thereof. Composite members 1a to 1d each have a warped shape which is concave on the element side and convex on the cooling side.

Each of composite members 1a and 1b shown in FIGS. 1(A) and 1(B) has both of metal coating layers 3 and 4. A maximum thickness t1 of metal coating layer 3 on the element side is thicker than a maximum thickness t3 of metal coating layer 4 on the cooling side.

In composite member 1a shown in FIG. 1(A), each of metal coating layers 3 and 4 has a uniform thickness, and the maximum thicknesses of both layers 3 and 4 differ widely. In manufacturing composite member 1a, for example, spacers 300 having an appropriate size and a SiC aggregate (the SiC powder or compact described above) 100 as a raw material are housed in a flat mold 200. Then, a melted metal 110 of magnesium or the like is supplied into flat mold 200. In a manufacturing method utilizing spacers 300, it is preferable to utilize a compact such as the powder compact or the sintered body described above as SiC aggregate 100, because a gap enough to form the metal coating layer can be easily provided between SiC aggregate 100 and the mold. In flat mold 200 shown in FIG. 1(A), the thickness of the metal coating layer to be formed on one of surfaces of the SiC aggregate forming the pair of opposite surfaces of the substrate which is not in contact with spacers 300 (here, metal coating layer 3 on the element side) can be adjusted by adjusting the supply amount of melted metal 110.

As described in manufacturing method 1, when the thickness of one metal coating layer (here, metal coating layer 3 on the element side) is thickened sufficiently, the substrate becomes deformed during cooling of melted metal 110 due to a difference in the amounts of thermal contraction of both metal coating layers 3 and 4. Accordingly, composite member 1a taken out from flat mold 200 after cooling has a specific warped shape as shown in FIG. 1(A).

It is noted that the forms of the molds shown in FIGS. 1 and 2 are exemplary, and a mold having surfaces for forming metal coating layer 3 and 4 arranged on the left and the right may be utilized. In this case, the metal coating layers can be formed on both surfaces of the substrate by arranging the spacers between the mold and each of a pair of surfaces of the SiC aggregate forming each of the pair of opposite surfaces of the substrate. Further, in any of the forms shown in FIGS. 1 and 2, a curved mold 210 in which a surface for forming a metal coating layer or a surface for forming a composite material has a predetermined warped shape (see FIG. 1(D)) can be utilized instead of flat mold 200. When curved mold 210 is utilized, warpage of mold 210 can be transferred to the composite member. Therefore, by adjusting the state of warpage of curved mold 210, a composite member having a specific warped shape can be easily formed, or a warpage amount of the composite member can be adjusted. Representatively, warpage of the composite member can be increased according to a warpage amount of the mold. The warpage amount can also be adjusted by performing surface treatment such as cutting, or by using a curved mold in addition to performing surface treatment.

In composite member 1b shown in FIG. 1(B), metal coating layer 3 on the element side has a uniform thickness, and metal coating layer 4 on the cooling side has a thickness which is thick at a central portion and becomes thin from the central portion toward each edge side. Further, composite member 1b has a small difference between the maximum thicknesses of both layers 3 and 4. In a manufacturing method for composite member 1b, for example, spacers 300 having an appropriate size and SiC aggregate 100 are housed in flat mold 200, as with composite member 1a. Then, melted metal 110 is charged into flat mold 200 for infiltration. However, in composite member 1b, the size of spacers 300 and the supply amount of melted metal 110 are adjusted to obtain a small difference between the thicknesses of both layers 3 and 4. A coated compact 10b taken out from mold 200 has a small warpage as shown in FIG. 1(B), due to a small difference between the thicknesses of both layers 3 and 4b. Accordingly, the warpage is adjusted by performing surface treatment such as cutting on metal coating layer 4b on the cooling side of coated compact 10b. The warpage amount can also be adjusted utilizing curved mold 210 as described above.

Composite members 1c and 1d shown in FIGS. 1(C) and 1(D) each have only metal coating layer 3 on the element side. Metal coating layer 3 has a uniform thickness. Composite member 1c has thick metal coating layer 3, and composite member 1d has thin metal coating layer 3. Composite members 1c and 1d are obtained, for example, by charging SiC aggregate 100 and melted metal 110 into flat mold 200 for infiltration. In composite member 1c, since metal coating layer 3 is sufficiently thick, composite member 1c is solidified to stretch the cooling side (composite material side) due to thermal contraction of metal coating layer 3. Therefore, composite member 1c taken out from mold 200 has a specific warped shape as shown in FIG. 1(C). On the other hand, in a coated compact 10d, since metal coating layer 3 is thin, the composite material side is not sufficiently warped as shown in FIG. 1(D) when flat mold 200 is used. Accordingly, the warpage is adjusted by performing surface treatment such as cutting on a substrate 2d of coated compact 10d. Alternatively, composite member 1d may be fabricated by utilizing curved mold 210 as described above, without performing surface treatment. Alternatively, the warpage may be adjusted utilizing curved mold 210.

[Form in which Only One Surface of a Substrate has a Warped Shape]

Composite members 1e to 1j shown in FIGS. 2(E) to 2(J) each have substrate 2, and at least one of metal coating layer 3 on the element side and metal coating layer 4 on the cooling side. Composite members 1e to 1j each have a warped shape which is flat on the element side and convex on the cooling side only.

Composite members 1e and 1f shown in FIGS. 2(E) and 2(F) each have both of metal coating layers 3 and 4. Maximum thickness t1 of metal coating layer 3 on the element side is equal to maximum thickness t3 of metal coating layer 4 on the cooling side. Metal coating layer 3 on the element side has a thickness which is thick at a central portion and becomes thin from the central portion toward each edge side.

Metal coating layer 4 on the cooling side of composite member 1e shown in FIG. 2(E) has a uniform thickness. In a manufacturing method for composite member 1e, for example, a coated compact 10e is firstly fabricated as with composite member 1a.

Since obtained coated compact 10e has a sufficiently thick metal coating layer 3e on the element side, coated compact 10e has a warped shape as with composite member 1a, and metal coating layer 3e on the element side is also warped. Composite member 1e is obtained by performing surface treatment such as polishing on warped metal coating layer 3e on the element side to planarize the surface thereof. When compared with the composite material, metal coating layer 3e is easily cut and easily subjected to surface treatment.

In composite member 1f shown in FIG. 2(F), both of metal coating layers 3 and 4 have a thickness which is thick at a central portion and becomes thin from the central portion toward each edge side. In a manufacturing method for composite member 1f, a coated compact 10f is fabricated as with composite member 1b shown in FIG. 1(B) described above. Since coated compact 10f has a small difference between thicknesses of a metal coating layer 3f on the element side and a metal coating layer 4f on the cooling side, the element side has a small warpage, and the cooling side has substantially no warpage. Composite member 1f having both layers 3 and 4 with an equal maximum thickness is obtained by performing surface treatment such as polishing or cutting on coated compact 10f to planarize the surface of metal coating layer 3f on the element side and form metal coating layer 4f on the cooling side to have a warped shape.

Composite members 1g and 1h shown in FIGS. 2(G) and 2(H) each have only metal coating layer 3 on the element side. Metal coating layer 3 of composite member 1g shown in FIG. 2(G) has a uniform thickness, and metal coating layer 3 of composite member 1h shown in FIG. 2(H) has a thickness which is thick at a central portion and becomes thin from the central portion toward each edge side.

Composite member 1g shown in FIG. 2(G) has thin metal coating layer 3 on the element side. Thus, as with composite member 1d shown in FIG. 1(D) described above, a coated compact 10g fabricated using flat mold 200 is not substantially warped, and both of the element side and the cooling side are flat. Composite member 1g is obtained by performing surface treatment such as cutting on a substrate 2g of coated compact 10g. Alternatively, when curved mold 210 is utilized as described above, the surface treatment on substrate 2g containing SiC can be omitted, resulting in excellent manufacturability of the composite member.

Composite member 1h shown in FIG. 2(H) has metal coating layer 3 on the element side with a thick maximum thickness. Thus, composite member 1h is obtained by fabricating a coated compact 10h utilizing flat mold 200 as with composite member 1c shown in FIG. 1(C), and performing surface treatment such as polishing on a warped metal coating layer 3h on the element side. The warpage may be adjusted by adjusting the thickness of metal coating layer 3h on the element side, or curved mold 210 may be utilized as described above.

Composite members 1i and 1j shown in FIGS. 2(I) and 2(J) each have both of metal coating layers 3 and 4. Maximum thickness t1 of metal coating layer 3 on the element side is equal to maximum thickness t3 of metal coating layer 4 on the cooling side.

In composite member 1i shown in FIG. 2(I), each of metal coating layers 3 and 4 has a uniform thickness. In a manufacturing method for composite member 1i, for example, as shown in FIG. 2(I), SiC aggregate 100 is firstly housed in flat mold 200, and impregnated with the melted metal to fabricate a substrate 2i made of the composite material. By performing surface treatment such as cutting on substrate 2i, substrate 2i having specific warpage is obtained. Alternatively, when curved mold 210 is utilized instead of flat mold 200, substrate 2i having specific warpage can be obtained without performing surface treatment, resulting in excellent manufacturability. Composite member 1i is obtained by forming metal coating layers 3 and 4 on substrate 2i having the specific warpage by an appropriate technique such as the hot-dip plating method described above. In this form, various compositions of the metal coating layers can be selected as described above.

In composite member 1j shown in FIG. 2(J), metal coating layer 3 on the element side has a uniform thickness, and metal coating layer 4 on the cooling side has a thickness which is thick at a central portion and becomes thin from the central portion toward each edge side. In a manufacturing method for composite member 1j, for example, spacers 300 having an appropriate size and SiC aggregate 100 are housed in flat mold 200, and melted metal 110 is infiltrated thereinto to fabricate a coated compact 10j. However, the size of spacers 300 and the supply amount of melted metal 110 are adjusted such that both metal coating layers 3 and 4j have an equal thickness. Since metal coating layer 3 on the element side and metal coating layer 4j on the cooling side of coated compact 10j have an equal thickness, coated compact 10j is not substantially warped, and both of the element side and the cooling side are flat. By performing surface treatment such as cutting on the cooling side of coated compact 10j, composite member 1j having specific warpage is obtained.

A composite member having no metal coating layer is obtained, for example, by performing surface treatment on substrate 2i made of the composite material, or fabricating the substrate using a curved mold, as described in FIG. 2(I).

Although curved mold 210 in FIGS. 1 and 2 has a cooling side with a convex shape, curved mold 210 having a cooling side with a concave shape may be utilized. Thereby, a composite member having a concave cooling side can be formed. Further, although FIGS. 1 and 2 show the forms in which surface treatment is performed to provide a convex cooling side, surface treatment may be performed to provide a concave cooling side.

<<Semiconductor Device>>

Figure 3:
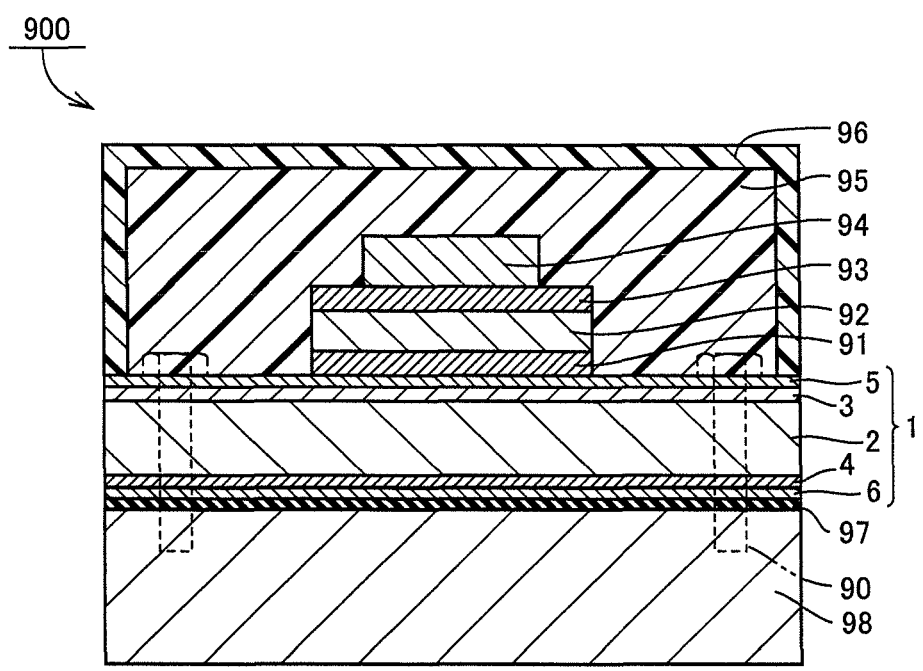
FIG. 3 is a cross sectional view schematically showing a configuration of a semiconductor device in one embodiment.

Referring to FIG. 3, a power module 900 (semiconductor device) in accordance with the present embodiment has a heat-dissipating member 1 composed of any of composite members 1a to 1j (FIGS. 1 and 2), a semiconductor chip 94 (semiconductor element), bolts 90, an insulating substrate 92, solder portions 91 and 93, a resin seal portion 95, a case 96, a grease portion 97, and a cooling device 98. In the configuration shown in this drawing, heat-dissipating member 1 has substrate 2, metal coating layers 3 and 4, and plating layers 5 and 6. Plating layers 5 and 6 are formed on metal coating layers 3 and 4, respectively. Heat-dissipating member 1 is mounted on a cooler 500 via grease portion 97, using bolts 100. Thereby, grease portion 97 is located between metal coating layer 4 and cooling device 98.

According to power module 900, grease portion 97 is pressed against cooling device 98 by heat-dissipating member 1, and thus is spread over cooling device 98. This can achieve sufficient adhesion between heat-dissipating member 1 and cooling device 98. Thereby, efficiency of dissipating heat from semiconductor chip 94 is improved.

Test Example 1

Composite members each having a substrate made of a composite material having SiC combined with pure magnesium and a metal coating layer as appropriate were fabricated, and shapes thereof were investigated.

Each sample was fabricated as described below.

As a raw material for a melted metal, an ingot of pure magnesium containing not less than 99.8% by mass of Mg and an impurity (a commercially available product) was prepared. For each sample denoted as "powder" in the column of "SiC Form" in Tables 1 and 2, SiC powder (average particle size: 90 μm, subjected to oxidation treatment at 875° C. for 2 hours) was prepared as SiC as a raw material. The amount of the SiC powder was adjusted such that the obtained composite material (substrate) would have a SiC content of 70% by volume. For each sample denoted as "compact" in the column of "SiC Form" in Table 2, a commercially available plate-like SiC sintered body (a porous body having a network portion composed of SiC, relative density: 80%) having an oxide film formed by performing oxidation treatment on the SiC sintered body at 875° C. for 2 hours was prepared. In each sample, SiC as a raw material, the size of a mold, and the thickness of appropriate spacers were adjusted such that the composite member including a metal coating layer would have a total thickness of 5 mm, and a length (mm) and a width (mm) shown in Tables 1 and 2. That is, in each sample having a metal coating layer, the thickness of a compact, the size of a mold, and the thickness of appropriate spacers were adjusted such that the metal coating layer would have a thickness shown in Tables 1 and 2.

A SiC aggregate (sintered body or powder) as a raw material was housed in a mold, melted pure magnesium was infiltrated into the SiC aggregate, and thereafter the pure magnesium was solidified. Of the samples having a metal coating layer, in each sample using the SiC sintered body, flat plate-like spacers (here, made of carbon) having a thickness shown in Table 1 were prepared and housed in a mold together with the SiC sintered body such that a metal coating layer having a thickness shown in Table 1 would be formed. Thereby, a gap corresponding to the thickness of the spacers is provided between the mold and the SiC sintered body, and a metal coating layer can be formed by charging the melted metal into the gap. Displacement of the spacers can be prevented by attaching the spacers to the SiC sintered body using low-melting-point glass, low-melting-point salt, liquid glass, or the like. In each sample using the SiC powder, the amount of charging the melted metal was adjusted such that a metal coating layer having a thickness (mm) shown in Table 2 would be formed on the element side of the substrate.

The mold was made of carbon. As a mold denoted as "No" in the column of the warpage amount shown in Table 1, a rectangular parallelepiped box body with one opened side (i.e., a flat mold) was prepared. Further, as a mold having a warpage amount (mm) shown in Table 1, a rectangular parallelepiped box body with one opened side in which one surface forming one surface on the cooling side had a convex shape or a concave shape (i.e., a curved mold) was prepared. The maximum protruding amount of the convex portion (see a maximum protruding amount td of curved die 210 in FIGS. 1(D) and 2(H)) or the maximum recessed amount of the concave portion corresponds to a warpage amount in Table 1. Since an internal space of each mold is utilized as a space for housing the SiC aggregate and the appropriate spacers, it is desirable to select the size of the internal space according to the size of a casting to be fabricated (here, any of a substrate made of a composite material, a coated compact, and a composite member having a metal coating layer).

As the mold, an integrally molded mold may be used, and a mold which is integrally formed by combining a plurality of divided pieces may also be used. Thereby, the casting can be easily taken out. Further, when a commercially available mold release agent is applied to a location where the SiC aggregate contacts in an inner peripheral surface of the mold, the casting is easily taken out.

An ingot placement portion is coupled to a peripheral edge of an opening in the mold. The above ingot is arranged on the ingot placement portion. The ingot is melted by heating the mold to a predetermined temperature. The mold was heated by a heatable atmosphere furnace in which the mold was set inside.

Here, the atmosphere furnace was adjusted to have an infiltration temperature of 875° C., an Ar atmosphere, and atmospheric pressure. The melted pure magnesium was poured from the opening in the mold into the internal space of the mold, and infiltrated into the SiC aggregate arranged in the internal space. The above heated state was maintained (here for 2 hours) to combine the SiC aggregate with the melted pure magnesium, and thereafter cooling (here, water-cooling) was performed under the Ar atmosphere to solidify the pure magnesium.

Through the above process, a composite member having a rectangular substrate made of a Mg—SiC composite material, or a composite member (coated compact) having the above substrate and a metal coating layer made of pure magnesium formed all over at least one of a pair of opposite surfaces of the substrate was obtained.

When components of the obtained composite member (coated compact) were investigated using an EDX device, it was found that the components of the substrate were Mg and SiC, the component of the remainder was an impurity, and the component of the metal coating layer was pure magnesium. Further, it was confirmed that the metal coating layer fabricated using the spacers had a thickness substantially equal to the thickness of the spacers used. Furthermore, when the composite member (coated compact) formed using the SiC sintered body was subjected to CP (cross-section polishing) processing to take a cross section in the thickness direction, and the cross section was investigated through SEM observation, it was found that SiC in the substrate had a net-like appearance and was formed as a porous body in which SiCs were bonded by SiC, that is, a porous body having a network portion composed of SiC, which was the same as the SiC sintered body used as a raw material. When the cross section was observed with an optical microscope, it was able to confirm that pure magnesium was infiltrated into a gap between SiCs, and that the metal coating layer formed on the surface of the substrate was continuous with a matrix metal of the substrate.

Further, when a SiC content in the substrate of each sample was measured, the sample formed using the SiC sintered body had a SiC content of 80% by volume, and the sample formed using the SiC powder had a SiC content of 70% by volume.

The SiC content was determined as described below. Each composite member was subjected to CP processing to take a cross section in the thickness direction, and a substrate portion in the cross section was observed with an optical microscope (×50 magnification). This observed image was subjected to image processing using a commercially available image analysis device to determine a total area of SiC in the substrate portion. A value obtained by converting the total area into a volume ratio was adopted as a volume ratio based on this cross section (i.e., area ratio≈volume ratio), volume ratios in the cross sections of n=3 were determined, and an average value thereof was calculated as the SiC content.

In some samples of the obtained coated compacts, surface treatment (here, plane polishing) was performed on the metal coating layer on the element side such that the surface of the metal coating layer on the element side would be planarized. Further, in some samples of the obtained coated compacts, surface treatment (here, cutting) was performed on the metal coating layer on the cooling side to form warpage. Specifically, surface treatment was performed such that the metal coating layer on the cooling side would be cut so as to be thick in a central portion and become thin toward each edge side, and such that the maximum cutting amount (at the edge side) would be an amount (μm) shown in Table 1.

A warpage amount (mm) and a warpage degree ($\times 10^{-3}$) of each obtained composite member were investigated. Tables 1 and 2 show results thereof. In order to measure the warpage amount (mm), surface displacement was measured for each of a pair of opposite surfaces of each composite member (with a length of 190 mm and a width of 140 mm), along a diagonal line (length Dmax: about 236 mm) as the longest side of each surface. A difference between the maximum value and the minimum value of the measured displacement (i.e., lmax) was defined as the warpage amount (mm). Here, a larger one of differences lmax of the surfaces was used. The warpage degree ($\times 10^{-3}$) was defined as a ratio of warpage amount lmax to length Dmax of the diagonal line.

Further, an example of a concrete form of each obtained composite member is denoted in the column of "Form" in Tables 1 and 2, using the reference numerals shown in FIGS. 1 and 2.

TABLE 1

| | | Size of Composite Member (mm): Length: 190 Width: 140, Thickness: 5 | | | | | | | | |
|---|---|---|---|---|---|---|---|---|---|---|
| | | Coating Thickness | | Difference | Mold | Surface Treatment | | | | |
| Sample No. | SiC Form | Element Side mm | Cooling Side mm | in Coating Thickness mm | Warpage Amount μm | Element Side mm | Cooling Side μm | Warpage Amount μm | Warpage Degree $\times 10^{-3}$ | Form |
| 1-1 | Powder | 0 | No | 0 | No | No | No | 0.0 | 0.00 | — |
| 1-2 | | 0.01 | | 0.01 | | | | 23.6 | 0.10 | 1c |
| 1-3 | | 0.02 | | 0.02 | | | | 48.1 | 0.21 | 1c |
| 1-4 | | 0.04 | | 0.04 | | | | 112.2 | 0.48 | 1c |
| 1-5 | | 0.06 | | 0.06 | | | | 143.4 | 0.62 | 1c |
| 1-6 | | 0.08 | | 0.08 | | | | 190.7 | 0.82 | 1c |
| 1-7 | | 0.1 | | 0.1 | | | | 237.9 | 1.03 | 1c |
| 1-8 | | 0.2 | | 0.2 | | | | 471.6 | 2.03 | 1c |
| 1-9 | | 0.3 | | 0.3 | | | | 701.9 | 3.03 | 1c |
| 1-10 | | 0.4 | | 0.4 | | | | 927.2 | 4.00 | 1c |
| 1-11 | | 0.5 | | 0.5 | | | | 1145.7 | 4.94 | 1c |
| 1-12 | | 0.6 | | 0.6 | | | | 1358.3 | 5.85 | 1c |
| 1-13 | | 0.7 | | 0.7 | | | | 1564.1 | 6.74 | 1c |
| 1-14 | | 0.8 | | 0.8 | | | | 1762.4 | 7.60 | 1c |
| 1-15 | | 0.9 | | 0.9 | | | | 1953.9 | 8.42 | 1c |
| 1-16 | | 1 | | 1 | | | | 2136.9 | 9.21 | 1c |
| 1-17 | | 1.5 | | 1.5 | | | | 2927.4 | 12.62 | 1c |
| 1-18 | | 2 | | 2 | | | | 3514.6 | 15.15 | 1c |

TABLE 1-continued

Size of Composite Member (mm): Length: 190 Width: 140, Thickness: 5

| Sample No. | SiC Form | Coating Thickness Element Side mm | Coating Thickness Cooling Side mm | Difference in Coating Thickness mm | Mold Warpage Amount mm | Surface Treatment Element Side mm | Surface Treatment Cooling Side μm | Warpage Amount μm | Warpage Degree ×10⁻³ | Form |
|---|---|---|---|---|---|---|---|---|---|---|
| 1-19 | | 2.5 | | 2.5 | | | | 3917.0 | 16.88 | 1c |
| 1-20 | | 0 | | 0 | 25 | | | 25.5 | 0.11 | — |
| 1-21 | | 0 | | 0 | 45 | | | 46.4 | 0.20 | — |
| 1-22 | | 0 | | 0 | 67 | | | 67.3 | 0.29 | — |
| 1-23 | | 0 | | 0 | −45 | | | −44.1 | −0.19 | — |
| 1-24 | | 0.04 | | 0.04 | −50 | | | 62.6 | 0.27 | — |
| 1-25 | | 0.08 | | 0.08 | −90 | | | 99.8 | 0.43 | — |
| 1-26 | | 1 | | 1 | −2000 | | | 136.9 | 0.59 | — |
| 1-27 | | 0 | | 0 | No | | 100 | 98.4 | 0.42 | 2i |
| 1-28 | | 0 | | 0 | | | 150 | 151.2 | 0.65 | 2i |
| 1-29 | | 0.5 | | 0.5 | 0.4 | | No. | 284.6 | 1.23 | 1h |
| 1-30 | | 1 | | 1 | 0.9 | | | 312.1 | 1.35 | 1h |

TABLE 2

Mold: Flat Mold
Size of Composite Member (mm): Length: denoted in Table 2, Width: denoted in Table 2, Thickness: 5

| Sample No. | SiC Form | Coating Thickness Element Side mm | Coating Thickness Cooling Side mm | Difference in Coating Thickness mm | Surface Treatment Element Side mm | Surface Treatment Cooling Side μm | Warpage Amount μm | Warpage Degree ×10⁻³ | Form | Composite Member Size mm |
|---|---|---|---|---|---|---|---|---|---|---|
| 2-1 | Compact | 0 | No | 0 | No | No | 0.0 | 0.00 | — | Length: 190 |
| 2-2 | | 0.01 | | 0.01 | | | 0.5 | 0.00 | 1c | Width: 140 |
| 2-3 | | 0.02 | | 0.02 | | | 2.1 | 0.01 | 1c | |
| 2-4 | | 0.04 | | 0.04 | | | 8.5 | 0.04 | 1c | |
| 2-5 | | 0.06 | | 0.06 | | | 19.0 | 0.08 | 1c | |
| 2-6 | | 0.08 | | 0.08 | | | 33.8 | 0.15 | 1c | |
| 2-7 | | 0.1 | | 0.1 | | | 52.9 | 0.23 | 1c | |
| 2-8 | | 0.2 | | 0.2 | | | 211.5 | 0.91 | 1c | |
| 2-9 | | 0.3 | | 0.3 | | | 476.0 | 2.05 | 1c | |
| 2-10 | | 0.4 | | 0.4 | | | 846.2 | 3.65 | 1c | |
| 2-11 | | 0.5 | | 0.5 | | | 1322.2 | 5.70 | 1c | |
| 2-12 | | 0.6 | | 0.6 | | | 1903.9 | 8.21 | 1c | |
| 2-13 | | 0.7 | | 0.7 | | | 2591.4 | 11.17 | 1c | |
| 2-14 | | 0.8 | | 0.8 | | | 3384.7 | 14.59 | 1c | |
| 2-15 | | 0.9 | | 0.9 | | | 4283.8 | 18.46 | 1c | |
| 2-16 | | 1 | | 1 | | | 5288.6 | 22.80 | 1c | |
| 2-17 | | 1.5 | | 1.5 | | | 11899.4 | 51.29 | 1c | |
| 2-18 | | 2 | | 2 | | | 21154.4 | 91.18 | 1c | |
| 2-19 | | 2.5 | | 2.5 | | | 33053.8 | 142.47 | 1c | |
| 2-20 | | 0.5 | 0.5 | 0 | | | 0.0 | 0.00 | — | |
| 2-21 | | 0.5 | 0.3 | 0.2 | | | 213.4 | 0.92 | 1a | |
| 2-22 | | 0.5 | 0.1 | 0.4 | | | 812.0 | 3.50 | 1a | |
| 2-23 | | 0.5 | 0.1 | 0.4 | 0.4 | | 2.3 | 0.01 | 1e | |
| 2-24 | | 0.5 | 0.1 | 0.4 | 0.2 | | 204.2 | 0.88 | 1e | |
| 2-25 | | 0.5 | 0 | 0.5 | 0.4 | | 83.6 | 0.36 | 1h | |
| 2-26 | | 0.5 | 0.5 | 0 | 0 | 100 | 101.2 | 0.44 | — | |
| 2-27 | | 0.5 | 0.5 | 0 | 0 | 150 | 150.3 | 0.65 | — | |
| 3-1 | Powder | 0.3 | No | 0.3 | No | No | 691.4 | 2.98 | 1c | 50 × 50 |
| 3-2 | | 0.3 | | 0.3 | | | 698.3 | 3.01 | 1c | 10 × 10 |
| 3-3 | | 0.02 | | 0.02 | | | 48.7 | 0.21 | 1c | 50 × 50 |
| 3-4 | | 0.02 | | 0.02 | | | 44.1 | 0.19 | 1c | 10 × 10 |
| 4-1 | Compact | 0.3 | | 0.3 | | | 471.0 | 2.03 | 1c | 50 × 50 |
| 4-2 | | 0.3 | | 0.3 | | | 477.9 | 2.06 | 1c | 10 × 10 |
| 4-3 | | 0.02 | | 0.02 | | | 2.1 | 0.01 | 1c | 50 × 50 |
| 4-4 | | 0.02 | | 0.02 | | | 2.3 | 0.01 | 1c | 10 × 10 |

As shown in Tables 1 and 2, it is found that a composite member satisfying a warpage degree (absolute value) of not less than $0.01 \times 10^{-3}$ and not more than $10 \times 10^{-3}$ can be obtained by forming a metal coating layer on at least one surface of a substrate simultaneously with the formation of the substrate by the infiltration method, and adjusting the thickness of the metal coating layer, adopting a mold with a specific shape, or performing appropriate surface treatment. When the composite member having this specific warpage degree is fixed to an installation object with bolts or the like to be utilized as a heat-dissipating member for a semiconductor element, the composite member is fixed to flatten out the warpage, and thus the composite member adheres to the installation object. Thereby, the composite member can efficiently dissipate heat of the semiconductor element and the like to the installation object, and is excellent in heat dissipation.

Hereinafter, a description will be given in more detail. As shown in samples Nos. 1-2 to 1-19 and 2-2 to 2-19, it is found that, when a metal coating layer is formed on one surface of the substrate, a composite member satisfying the specific warpage degree can be obtained by forming a thick metal coating layer with a thickness of not less than 0.01 mm, and that a larger warpage amount can be obtained with an increase in the thickness. In particular, it can be said that a composite member satisfying the specific warpage degree can be obtained in this test, when the metal coating layer has a thickness of not more than 1 mm (i.e., not more than 20% of the total thickness (5 mm) of the composite member) in the case of using the SiC powder, and when the metal coating layer has a thickness of not more than 0.6 mm (i.e., not more than 12% of the total thickness (5 mm) of the composite member) in the case of using the SiC sintered body.

As shown in samples Nos. 1-20 to 1-23, 1-27, and 1-28, it is found that a composite member satisfying the specific warpage degree can be obtained by using a curved mold, without forming a metal coating layer. Further, as shown in samples Nos. 1-24, 1-25, and 1-26, it is found that the warpage degree can be adjusted by using a curved mold in addition to forming a metal coating layer. In particular, it is found that warpage of a composite member can also be adjusted by using a concave curved mold. Thus, the warpage amount may be adjusted by combining the thickness of a metal coating layer with the shape of a mold. As shown in samples Nos. 1-29 and 1-30, it is found that the warpage amount can be adjusted and the surface can be planarized by performing surface treatment on a metal coating layer. In samples Nos. 1-29 and 1-30, the metal coating layer has a maximum thickness in a cross section in the thickness direction of 0.1 mm, and has a difference between the maximum thickness and the minimum thickness satisfying not less than 0.03 mm.

When metal coating layers are formed on both surfaces of a substrate, it is found that a composite member which is not substantially warped and is flat is obtained in the case where the both layers have an equal thickness as shown in sample No. 2-20, and a composite member having the specific warpage is obtained in the case where difference $|t_1\text{max}-t_2\text{max}|$ between the both layers is not less than 0.02 mm as shown in samples Nos. 2-21 and 2-22, and that a larger warpage can be obtained with an increase in the difference. As shown in samples Nos. 2-23, 2-24, and 2-25, it is found that the warpage amount can also be adjusted by forming a thick metal coating layer and adjusting its thickness by surface treatment. In these samples Nos. 2-23, 2-24, and 2-25, the element side has a flat surface, and the metal coating layer has a maximum thickness in a cross section in the thickness direction of 0.1 mm, and has a difference between the maximum thickness and the minimum thickness satisfying not less than 0.03 mm. Further, as shown in samples Nos. 2-26 and 2-27, it is found that, even when the both layers have an equal thickness, a composite member having the specific warpage can be obtained by performing surface treatment.

The samples subjected to surface treatment are subjected to the surface treatment immediately after the melted metal is cooled. The surface treatment can also be performed after appropriate heat treatment (for example, at 30° C. for 144000 minutes (100 days)) is performed on a coated compact. When such heat treatment is performed, a change in the warpage amount during surface treatment tends to be smaller. The warpage amount can be varied by varying a time period when surface treatment is to be performed, or performing appropriate heat treatment.

In addition, as shown in samples Nos. 3-1 to 3-4 and 4-1 to 4-4, a similar warped shape can also be obtained even when the size of a composite member is changed.

It is noted that, for each obtained sample composite member, a test piece was cut out from a composite material portion (substrate) of each sample to measure a thermal expansion coefficient (ppm/K) and thermal conductivity (W/m·K) using a commercially available measuring instrument. The thermal expansion coefficient was measured for the range from 30° C. to 150° C. As a result, the samples formed using the SiC powder (SiC content: 70% by volume) had a thermal expansion coefficient of 7.5 ppm/K and a thermal conductivity of 230 W/m·K, and the samples formed using the SiC sintered body (SiC content: 80% by volume) had a thermal expansion coefficient of 4.5 ppm/K and a thermal conductivity of 300 W/m·K.

When magnesium-based composite members each having a metal coating layer on one surface of a substrate were fabricated using the SiC powder as with sample No. 1-10 in the above test example, with the SiC content being changed in the range from 50% by volume to 80% by volume, composite members satisfying a warpage degree of not less than $0.01 \times 10^{-3}$ and not more than $10 \times 10^{-3}$ were obtained. When a filling density of SiC in a substrate is increased, plural types of powders having different average particle sizes can be utilized as appropriate. Further, as a SiC aggregate, an unsintered powder compact (such as a compact formed by tapping or slip casting) can be utilized.

In a composite member having metal coating layers on both surfaces of a substrate, a sample having metal coating layers which satisfied a difference between the thicknesses of the both layers of not less than 0.02 mm and had actual thicknesses different from those of the metal coating layers of samples Nos. 2-21 and 2-22 was fabricated. As a result, a warpage degree similar to those of samples Nos. 2-21 and 2-22 was obtained.

Test Example 2

A substrate made of a composite material having SiC combined with pure magnesium was fabricated and sandwiched between a pair of dies to fabricate a composite member having a warped shape.

In this test, a plurality of substrates (length: 190 mm, width: 140 mm, thickness: 5 mm) made of a Mg—SiC composite material were fabricated, as with sample No. 1-1 in Test Example 1. Further, a plurality of a pair of dies having a first curved die having a concave surface with a spherical radius shown in Table 3 and a second curved die having a convex surface with the same spherical radius were prepared. Here, dies having a spherical radius SR of 2000 mm to 300000 mm as shown in Table 3 were prepared respectively. The warpage amount of each pair of dies shown in Table 3 indicates the maximum recessed amount of the concave surface and the maximum protruding amount of the convex surface. All of the dies were made of dies steel (SKD). The fabricated substrate was sandwiched between the first curved die and the second curved die of each prepared pair of dies, heated to a heating temperature shown in Table 3, thereafter held for 10 minutes at the heating temperature and under a load shown in Table 3, and then taken out from the dies. A warpage amount (μm) and a warpage degree ($\times 10^{-3}$) of each substrate taken out were measured as in Test Example 1. Table 3 shows results thereof.

TABLE 3

| Sample No. | Die Spherical Radius: SR mm | Die Warpage Amount μm | Die Heating Temperature °C. | Die Load kg/cm$^2$ | Mg—SiC Warpage Amount μm | Mg—SiC Warpage Degree ×10$^{-3}$ |
|---|---|---|---|---|---|---|
| 5-1 | 2000 | 3366.8 | 250 | 100 | 3358.1 | 14.47 |
| 5-2 | 3000 | 2243.1 | 250 | 100 | 2138.1 | 9.22 |
| 5-3 | 14500 | 464 | 250 | 100 | 460.2 | 1.98 |
| 5-4 | 35000 | 192.2 | 250 | 100 | 190.5 | 0.82 |
| 5-5 | 50000 | 134.6 | 250 | 100 | 134.4 | 0.58 |
| 5-6 | 100000 | 67.3 | 250 | 100 | 67.2 | 0.29 |
| 5-7 | 145000 | 46.4 | 250 | 100 | 46.3 | 0.20 |
| 5-8 | 300000 | 22.4 | 250 | 100 | 22.2 | 0.10 |
| 5-9 | No (flat) | 0 | 250 | 100 | 0 | 0.00 |
| 5-10 | 35000 | 192.2 | 250 | 1 | 1.3 | 0.006 |
| 5-11 | 35000 | 192.2 | 250 | 10 | 187.4 | 0.81 |
| 5-12 | 35000 | 192.2 | 250 | 50 | 192.1 | 0.83 |
| 5-13 | 35000 | 192.2 | 250 | 80 | 192.2 | 0.83 |
| 5-14 | 35000 | 192.2 | 250 | 100 | 192.2 | 0.83 |
| 5-15 | 35000 | 192.2 | 250 | 150 | 192.2 | 0.83 |
| 5-16 | 35000 | 192.2 | 250 | 200 | 192.2 | 0.83 |
| 5-17 | 35000 | 192.2 | 100 | 10 | 0 | 0.000 |
| 5-18 | 35000 | 192.2 | 100 | 30 | 1.1 | 0.005 |
| 5-19 | 35000 | 192.2 | 100 | 50 | 57.1 | 0.246 |
| 5-20 | 35000 | 192.2 | 100 | 100 | 74.3 | 0.320 |
| 5-21 | 35000 | 192.2 | 100 | 150 | 192.2 | 0.83 |
| 5-22 | 35000 | 192.2 | 200 | 50 | 142.8 | 0.62 |

As shown in Table 3, it is found that a composite member satisfying a warpage degree of not less than $0.01 \times 10^{-3}$ and not more than $10 \times 10^{-3}$ can also be obtained by applying a specific load at a specific heating temperature. Further, as shown in this test, it is found that a composite member having a desired warpage degree can be obtained by selecting the warpage amount of the dies, the heating temperature, and the load as appropriate. In addition, it is found from this test that, when the heating temperature is set to about 100° C. to 200° C., a composite member having the above specific warpage degree can be obtained by setting the load to not less than 50 kg/cm$^2$, and that when the heating temperature is set higher (here, 250° C.), a composite member having the above specific warpage degree can be obtained by setting the load to not less than 10 kg/cm$^2$.

Test Example 3

A plating layer was provided by an appropriate method on an element-side surface of a composite member satisfying the above specific warpage degree fabricated in Test Examples 1 and 2, and thereafter an insulating substrate was joined by soldering. As a result, the joined article after joining maintained a warped state similar to that of the composite member before joining.

A power module (semiconductor device: invented product) was fabricated using the composite member satisfying the above specific warpage degree as a heat-dissipating member. Specifically, a semiconductor element was joined by soldering to the element-side surface of the composite member provided with the insulating substrate to fabricate a power module. A commercially available heat-dissipating grease was applied over a cooling-side surface of the composite member of the power module, and thereafter the power module was attached to a cooling device with bolts. When the bolts were fastened, the composite member was pressed against the cooling device by fastening the bolts, and thus the grease was spread all over the cooling-side surface of the composite member, and excess grease was pushed out from between the composite member and the cooling device. When a contact surface between the composite member and the cooling device was checked by X-ray CT after the attachment, a pore with a diameter of not less than 1 mm was not found therebetween, and it was confirmed that the grease was sufficiently spread therebetween.

On the other hand, a power module (comparative product) was fabricated as with the above invented product, using a composite member not satisfying the above specific warpage degree as a heat-dissipating member, and the power module was attached to a cooling device via a heat-dissipating grease as with the above invented product. In this power module (comparative product), excess grease was not pushed out when the bolts were fastened, and the grease was thick as a whole. Further, when a contact surface between the composite member of the power module (comparative product) and the cooling device was checked by X-ray CT as with the above invented product, pores with a diameter of not less than 1 mm were found therebetween at various locations. Further, when an area ratio of the pores was investigated, the pores had a high area ratio of 5% to 10% relative to a plane area of a cooling-side surface of the composite member set as 100%. From these results, it was confirmed that the grease was not sufficiently spread between the composite member and the cooling device in the power module (comparative product).

The power module (invented product) fabricated using the composite member satisfying the above specific warpage degree as a heat-dissipating member and the power module (comparative product) fabricated using the composite member not satisfying the above specific warpage degree as a heat-dissipating member were operated under the same conditions to measure temperatures of the semiconductor elements. As a result, the semiconductor element in the power module (invented product) was lower than that of the power module (comparative product) by about 5° C. Thus, it is found that the power module (invented product) is excellent in heat dissipation.

The present invention is not limited to the embodiments described above, and can be modified as appropriate without departing from the gist of the present invention. For example, the SiC content in the substrate, the form of the presence of SiC, the composition of the matrix metal (for example, a magnesium alloy), the shape, length, width, and thickness of the composite member, the thickness of the metal coating layer, the region for forming the metal coating layer, and conditions at the time of combining can be modified as appropriate.

INDUSTRIAL APPLICABILITY

The composite member in accordance with the present invention can be suitably utilized as a heat spreader for a semiconductor element and the like of a semiconductor device provided to various electronic equipment. The heat-dissipating member in accordance with the present invention can be suitably utilized as a constituent member of the semiconductor device. The semiconductor device in accordance with the present invention can be suitably utilized as a constituent part of various electronic equipment.

REFERENCE SIGNS LIST

1: heat-dissipating member; 1a to 1j: composite member; 2: substrate; 3: metal coating layer on an element side; 4: metal coating layer on a cooling side; 10b, 10d, 10e, 10f, 10g, 10h, 10j: coated compact; 2d, 2g, 2i: substrate of the coated compact; 3e, 3f, 3h, 4b, 4f, 4j: metal coating layer of the coated compact; 90: bolt; 94: semiconductor chip (semiconductor element); 100: SiC aggregate; 110: melted metal; 200: flat mold; 210: curved mold; 300: spacer; 900: power module (semiconductor device).

The invention claimed is:

1. A composite member, comprising
a substrate made of a composite material having SiC combined with pure magnesium containing not less than 99.8% by mass of Mg and an impurity, or a magnesium alloy composed of an additive element and the remainder containing Mg and an impurity, the total content of the additive element is not more than 20% by mass when the entire alloy is set as 100% by mass, the composite member satisfying a warpage degree of not less than $0.01 \times 10^{-3}$ and not more than $2.0 \times 10^{-3}$, said warpage degree being defined as a ratio of Imax to Dmax (Imax/Dmax), where Imax being a difference between a maximum value and a minimum value of surface displacement of one surface of said composite member measured along a longest side thereof, and Dmax being a length of said longest side, the composite member further comprises a metal coating layer on at least a portion of said substrate, and said metal coating layer has a concavely curved shape in which a thickness of said metal coating layer is thinnest at a central portion and becomes thick toward each edge portion, in a cross section in a thickness direction of said composite member.

2. The composite member according to claim 1, wherein said substrate has a SiC content of not less than 50% by volume and not more than 90% by volume.

3. The composite member according to claim 1, wherein said substrate has a thermal expansion coefficient of not less than 4 ppm/K and not more than 15 ppm/K, and a thermal conductivity of not less than 180 W/m·K.

4. A heat-dissipating member composed of a composite member as recited in claim 1.

5. A semiconductor device, comprising a heat-dissipating member as recited in claim 4, and a semiconductor element mounted on the heat-dissipating member.

* * * * *